(12) United States Patent
Liao et al.

(10) Patent No.: US 6,776,850 B2
(45) Date of Patent: Aug. 17, 2004

(54) PREVENTATIVE MAINTENANCE AIDED TOOL FOR CVD CHAMBER

(75) Inventors: Miao-Cheng Liao, Hsinchu (TW); Ying-Lang Wang, Tai-Chung County (TW); Hung-Hsin Liang, Hsinchu (TW); Hsiang-Sheng Cheng, Hsinchu (TW); Sheng-Te Shu, Taoyuan (TW); Chih-Yuan Yang, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 116 days.

(21) Appl. No.: 10/165,541

(22) Filed: Jun. 8, 2002

(65) Prior Publication Data
US 2003/0228751 A1 Dec. 11, 2003

(51) Int. Cl.[7] .............................................. C23C 16/00
(52) U.S. Cl. ....................... 118/728; 118/725; 118/720; 118/715
(58) Field of Search ................................. 118/728, 725, 118/720, 715

(56) References Cited

U.S. PATENT DOCUMENTS

| | | | | |
|---|---|---|---|---|
| 5,447,570 A | * | 9/1995 | Schmitz et al. | 118/728 |
| 5,516,367 A | * | 5/1996 | Lei et al. | 118/725 |
| 5,556,476 A | * | 9/1996 | Lei et al. | 118/728 |
| 5,882,417 A | * | 3/1999 | van de Ven et al. | 118/728 |
| 6,040,011 A | * | 3/2000 | Yudovsky et al. | 427/255.28 |
| 6,258,170 B1 | * | 7/2001 | Somekh et al. | 118/715 |
| 6,296,712 B1 | * | 10/2001 | Guo et al. | 118/728 |

* cited by examiner

Primary Examiner—John Niebling
Assistant Examiner—Olivia T. Luk
(74) Attorney, Agent, or Firm—Tung & Associates

(57) ABSTRACT

A preventive maintenance tool which may be installed on a metal chemical vapor deposition (CVD) chamber to prevent escape of contaminating and toxic gases from the chamber interior during preventative maintenance (PM) cleaning of the chamber. The tool comprises a cylindrical tool body which fits to the lid O-ring of the chamber to form a gas-tight seal therewith; a vacuum line connector nipple extending from the body for connection to a vacuum line; and a lid panel rotatably mounted in the body and fitted with a pair of hinged closing panels for reversibly sealing the chamber and facilitating chamber cleaning.

16 Claims, 3 Drawing Sheets

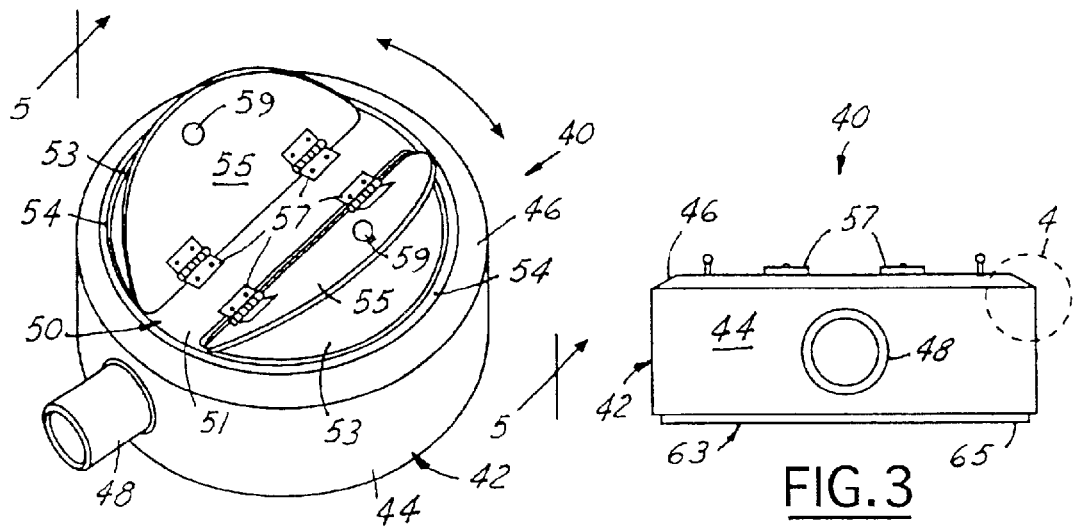
FIG. 2
FIG. 3
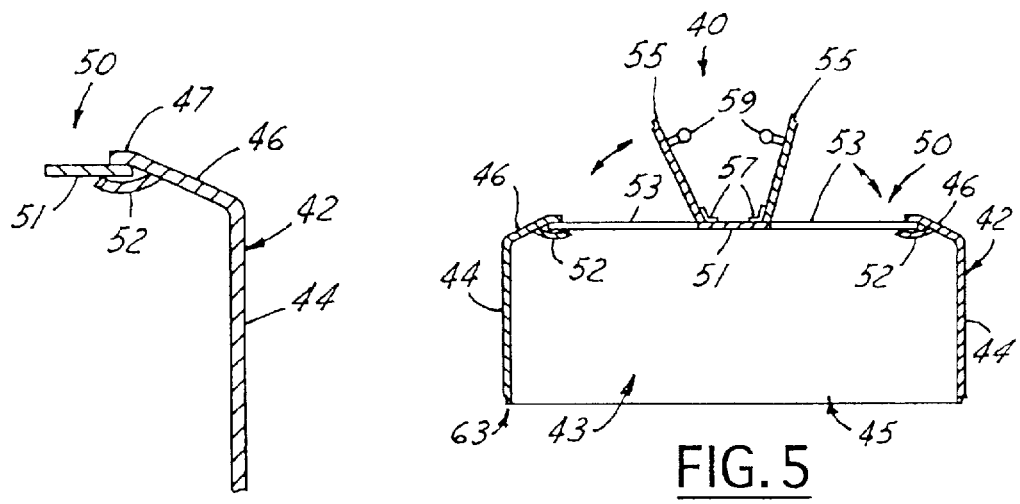
FIG. 4
FIG. 5
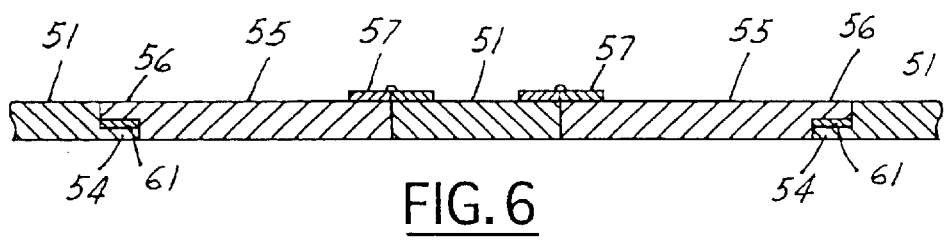
FIG. 6

PREVENTATIVE MAINTENANCE AIDED TOOL FOR CVD CHAMBER

FIELD OF THE INVENTION

The present invention relates to CVD (chemical vapor deposition) chambers for depositing conductive and insulative material layers on semiconductor wafer substrates. More particularly, the present invention relates to a tool for preventing diffusion of toxic, corrosive and/or flammable process or cleaning gases from a CVD chamber during periodic chamber cleaning and maintenance.

BACKGROUND OF THE INVENTION

Semiconductor processing is carried out in specialized apparatus including multiple chambers wherein semiconductor wafers are processed by the deposition of multiple conductive and insulative layers on the wafers and treatment of the layers to form integrated circuits on the wafers. A common process involved in manufacturing integrated circuits on semiconductor wafer substrates includes depositing a dielectric layer over a metal region on a substrate; etching multiple openings in the dielectric layer such that each opening exposes a contact area on the region; and then filling each opening with an electrically-conductive material using a chemical vapor deposition (CVD) process to form a plug that establishes electrical contact with the contact region. Tungsten is one of the metals most commonly used to form the electrically-conducting plug. However, formation of a tungsten plug using tungsten chemical vapor deposition processes requires the use of several toxic, corrosive, and pyrophoric process chemicals and gases. Table 1 lists some of the common hazardous gases used in a typical tungsten chemical vapor deposition processes, along with the chemical symbol/formula, health and fire hazards and hazardous concentrations of each.

TABLE 1

Tungsten CVD Process Gas and Chemical Hazards

| Chemical Name | Symbol/ Formula | Health Hazard | TLV-TWAa | Fire Hazard |
|---|---|---|---|---|
| Argon | Ar | Simple asphyxiant | n/a | Non-flammable |
| Hydrogen | $H_2$ | Simple asphyxiant | n/a | Flammable |
| Nitrogen | $N_2$ | Simple asphyxiant | n/a | Non-flammable |
| Silane | $SiH_4$ | Poison gas | 5 ppm | Pyrophoric gas |
| Tungsten Hexafluoride | $WF_6$ | Poison gas | 3 ppm (as HF) | Non-flammable |

Argon and nitrogen, while common, innocuous and non-flammable gases, must be handled with caution because these gases can cause asphyxiation by displacing oxygen necessary for breathing. Hydrogen, another relatively innocuous gas, is a flammable asphyxiant. $SiH_4$ is toxic and reacts with atmospheric air to form corrosive silicic acid. $WF_6$ is also toxic and reacts with atmospheric moisture to form hydrofluoric acid. To avoid leakage of these gases from the chamber during wafer substrate processing, a vacuum is continually maintained in the chamber by operation of a vacuum line connected to the chamber. The gases are thus drawn from the chamber interior through the vacuum line, where they are disposed of using conventional equipment and techniques.

In active semiconductor fabrication process chambers, particularly those in which etching or chemical vapor deposition processes are carried out, residues frequently form on the walls and other surfaces of the chambers during processing. Accordingly, regular periodic chamber cleanings between wafer processing cycles is necessary for maintaining CVD system performance in the production of high-quality integrated circuit devices. Such periodic chamber cleanings may be conducted without breaking the chamber vacuum seal. Preventative maintenance (PM) chamber cleanings, on the other hand, are performed between multiple periodic chamber cleanings and do require that the chamber vacuum seal be broken because the chamber lid must be opened in order to facilitate physically wiping down the chamber interior.

Table 2 lists two potentially hazardous gases, HC-116-hexafluoroethane and oxygen, which are commonly used in the periodic cleaning of CVD chambers, along with the chemical symbol/formula, health and fire hazards and hazardous concentrations of each.

TABLE 2

CVD Clean Cycle Gases

| Chemical Name | Symbol/ Formula | Health Hazard | TLV-TWAa | Fire Hazard |
|---|---|---|---|---|
| HC-116 Hexafluoroethane | $C_2F_6$ | Narcotic (at high concentration) | 1000 ppm | Flammable liquid decomposes in water |
| Oxygen | $O_2$ | Irritant (at high concentration) | n/a | Strong Oxidizer |

Although the vacuum seal maintained in the chamber system during the periodic chamber cleanings facilitates removal of most of the process gases and cleaning gases from the chamber, small quantities of these gases typically remain in the chamber interior when the chamber lid is opened to commence PM chamber cleaning. Because these process gases and cleaning gases are potentially harmful to process engineers and other cleaning or maintenance personnel in the immediate vicinity of the processing chambers, great care must be taken by such personnel to avoid exposure to these residual gases during PM chamber cleanings. Moreover, hydrogen peroxide, commonly used in the wet cleaning of the chamber interior during PM chamber cleanings, breaks down into water and hydrogen, and the water reacts with chamber deposits to form the corrosive and toxic hydrogen fluoride (HF).

According to industrial sanitation and safety standards, if potential toxic substances exist in a workplace, the first priority of health and safety personnel should be to eliminate or control the root causes or sources of such substances. The next priority is to eliminate or reduce toxin transference from the source to the personnel. The last priority is the direct protection of personnel by the use of masks, respirators or other equipment. Because no such method of direct protection is suitable for all situations and is incapable of total protection, however, the most effective prevention methods involve eliminating or controlling the root causes or sources of the toxic substances. Accordingly, a device is needed for preventing escape of toxic and corrosive gases from a CVD chamber during periodic maintenance chamber cleanings.

SUMMARY OF THE INVENTION

An object of the present invention is to provide a preventative maintenance tool for preventing exposure of personnel to harmful gases emanating from a process chamber.

Another object of the present invention is to provide a preventative maintenance tool for containing corrosive and toxic gases in a chemical vapor deposition (CVD) chamber during maintenance of the chamber.

Still another object of the present invention is to provide a preventative maintenance tool which provides access to the interior of a CVD chamber while preventing escape of potentially corrosive, toxic and harmful gases and chemicals from the chamber interior.

Yet another object of the present invention is to provide a preventative maintenance tool which may be removably installed on a variety of CVD chambers.

A still further object of the present invention is to provide a preventative maintenance tool which is simple in construction and installation.

Yet another object of the present invention is to provide a preventative maintenance tool which is versatile and simple in operation and enables complete access to the interior of a CVD chamber for thorough cleaning thereof.

Still another object of the present invention is to provide a preventative maintenance tool which substantially eliminates the need for chamber cleaning and maintenance personnel to wear protective equipment during preventative maintenance cleaning of a CVD chamber.

In accordance with these and other objects and advantages, the present invention is a preventative maintenance tool which may be installed on a metal chemical vapor deposition (CVD) chamber to prevent escape of contaminating and toxic gases from the chamber interior during preventative maintenance (PM) cleaning of the chamber. The tool comprises a cylindrical tool body which fits to the lid O-ring of the chamber to form a gas-tight seal therewith; a vacuum line connector nipple extending from the body for connection to a vacuum line; and a lid panel rotatably mounted in the body and fitted with a pair of hinged closing panels for reversibly sealing the chamber and facilitating chamber cleaning.

BRIEF DESCRIPTION OF THE DRAWINGS

The invention will now be described, by way of example, with reference to the accompanying drawings, wherein:

FIG. 2 is a perspective view of an illustrative embodiment of the PM (preventative maintenance) aided tool of the present invention;

FIG. 3 is a front view of the PM aided tool illustrated in FIG. 2;

FIG. 4 is a sectional view, taken along section line 4 in FIG. 3;

FIG. 5 is a sectional view, taken along section lines 5—5 in FIG. 2;

FIG. 6 is a cross-sectional view of the lid panel and closing panel components of the PM aided tool, with the lid panels shown disposed in the closed, sealing configuration;

DESCRIPTION OF THE PREFERRED EMBODIMENTS

The present invention has particularly beneficial utility in preventing escape of toxic, corrosive and/or flammable gases from a chemical vapor deposition chamber during periodic maintenance cleaning of the chamber. However, the invention is not so limited in application, and while references may be made to such chemical vapor deposition chambers, the invention is not so limited in application and may be applicable to a variety of mechanical and process applications.

Figures 1, 1A:
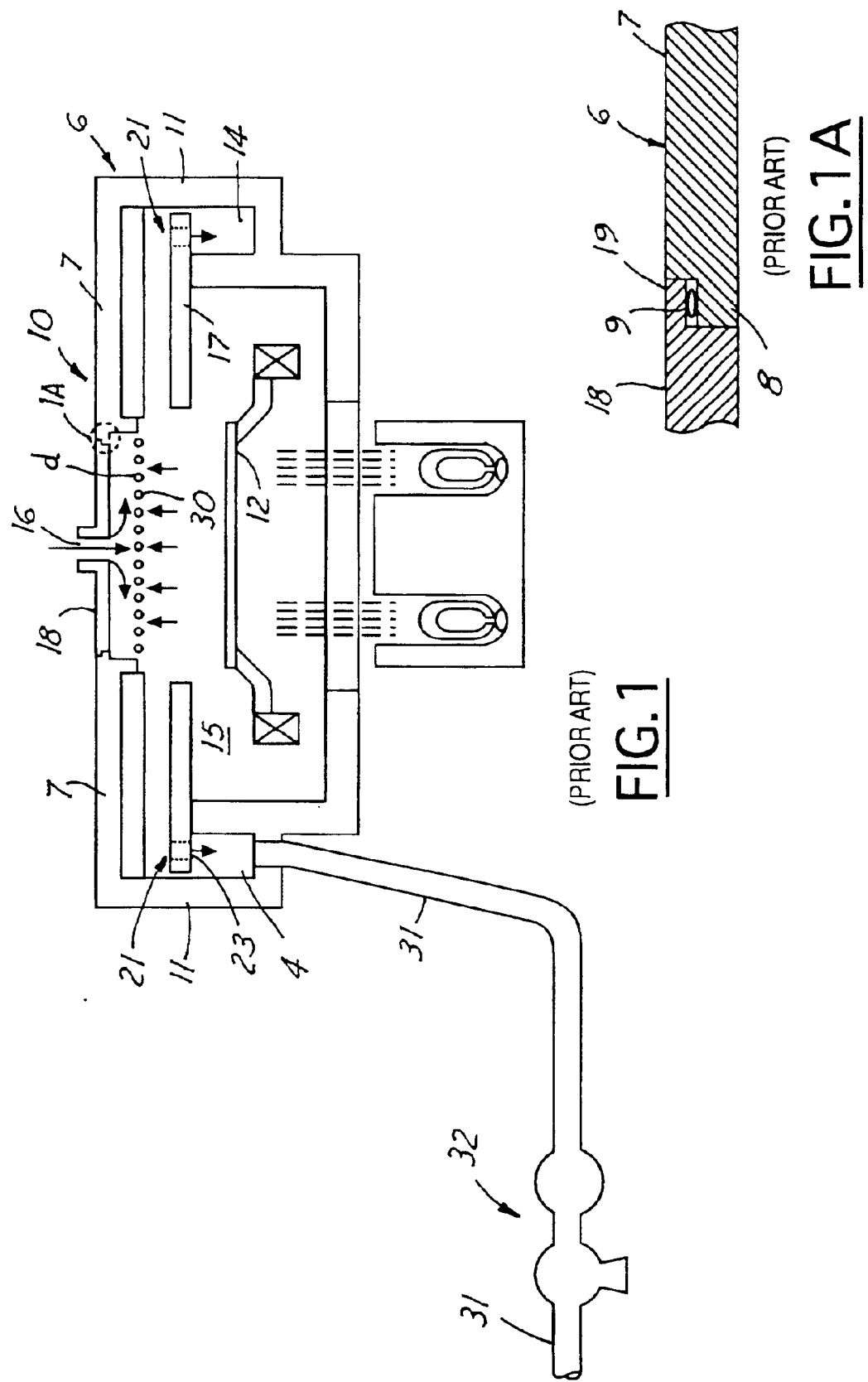
FIG. 1 is a schematic view illustrating a typical conventional chemical vapor deposition (CVD) system.
FIG. 1A is a sectional view, taken along section line 1A in FIG. 1, illustrating a lid conventionally removably mounted on the CVD system.

A typical conventional CVD (chemical vapor deposition) system is illustrated schematically by reference numeral 10 in FIG. 1. The CVD system 10 generally includes an enclosure assembly 6, having a vertically-movable wafer support pedestal 12 disposed beneath a showerhead 30, through which process gases enter a vacuum chamber 15. A pumping plate 17 may extend around the wafer support pedestal 12 for discharging process gases and other plasma residue from the chamber 15 and into a pumping channel 14 partially circumscribing the chamber 15, as indicated by the arrows 21.

The enclosure assembly 6 is typically an integral housing constructed of a process-compatible material such as anodized aluminum. The enclosure assembly 6 includes a continuous sidewall 11 and a top 7 that includes a top opening (not illustrated) sealed by a removable lid 18. As illustrated in FIG. 1A, the lid 18 may include an annular lid seal flange 19 which mates with a companion top seal flange 8 provided on the top 7 of the enclosure assembly 6. A gasket or o-ring 9 is typically provided on the top seal flange 8 to provide a gas-tight seal between the lid seal flange 19 and the top seal flange 8 when the lid 18 is mounted on the top 7 as illustrated. The lid 18 is typically provided with an inlet tube 16 for allowing deposition gases to enter the showerhead 30, where the gases are uniformly dispersed throughout the chamber 15 onto a wafer (not illustrated) supported on the wafer support pedestal 12. The deposition process performed in the apparatus 10 may be a thermal process, a plasma-enhanced process or other chemical vapor deposition process.

In a typical metal deposition process such as that used in the formation of a tungsten plug (not shown) in an opening formed in a dielectric layer on a wafer (not shown), deposition gases are introduced into the chamber 15 through the inlet tube 16 and the showerhead 30, respectively, where the gases are deposited into the opening (not illustrated) in the dielectric layer on the wafer. Upon completion of the CVD process, the gases are evacuated from the chamber 15 by operation of a pump (not illustrated) which induces vacuum pressure in the pumping channel 14 to draw the gases out of the chamber 15 and through the pumping channel 14, where the gases are discharged from the apparatus 10 through a discharge conduit 31 and throttle valve 32.

During the chemical deposition process, solid residues frequently form on the sidewalls 11, wafer support pedestal 12 and other interior surfaces of the chamber 15. Accordingly, regular periodic cleanings of the chamber 15 between CVD process cycles is necessary for maintaining performance of the CVD system 10 at optimum levels in the production of high-quality integrated circuit devices. Such periodic chamber cleanings are facilitated by introducing cleaning gases and chemicals into the chamber 15 through the inlet tube 16 and showerhead 30, respectively, while maintaining a vacuum in the chamber 15 by evacuating the gases through the discharge conduit 31 and throttle valve 32. While such periodic chamber cleaning cycles are effective in removing much of the residues from the interior surfaces of the CVD system 10, the residues tend to accumulate on the surfaces over time, and these must be removed using periodic preventative maintenance (PM) cleanings. In a PM cleaning, the lid 18 and showerhead 30 components of the CVD system 10 are removed and the vacuum pressure inside the chamber 15 is dispelled to facilitate manually wiping down the interior surfaces of the chamber 15 in order to remove the accumulated residues from the surfaces. Upon commencing the PM cleaning process, however, some toxic, corrosive and/or flammable residual deposition gases may remain in the chamber 15, and additional potentially harmful gases such as HF may be formed upon contact of hydrogen peroxide, a common cleaning agent, or water with the residues. These potentially harmful gases tend to escape from the open chamber 15 and into the ambient environment of the CVD system 10, where the gases may injure persons involved in the chamber-cleaning operation or other persons in the vicinity of the CVD system 10.

Figure 7:
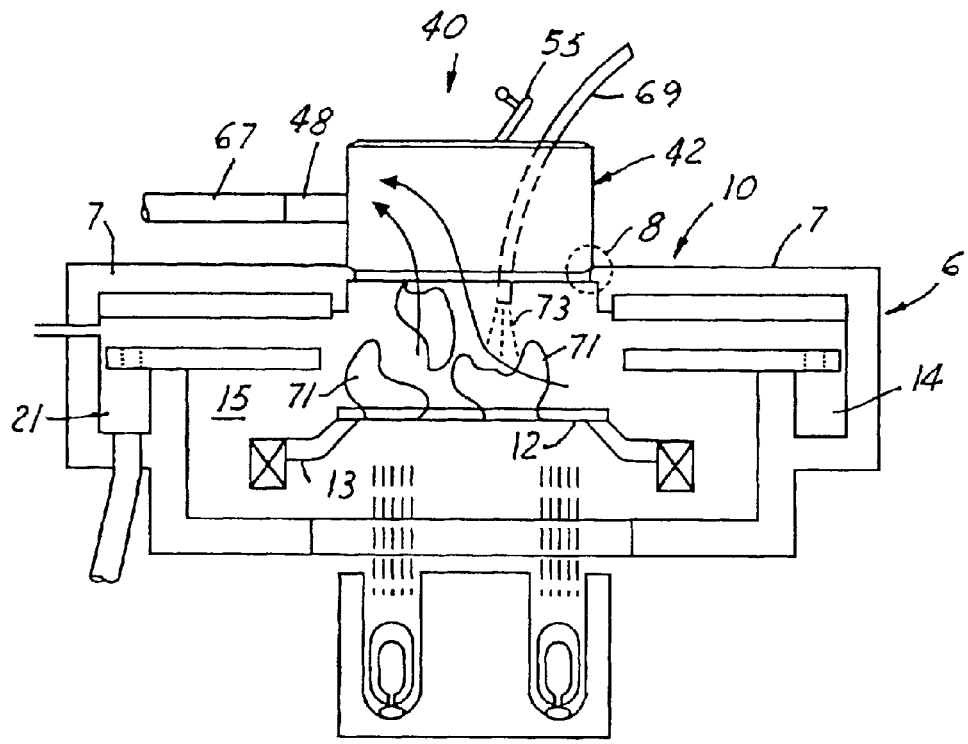
FIG. 7 is a schematic view of the CVD system, with the PM aided tool removably mounted on the system in typical application of the tool.
Figure 8:
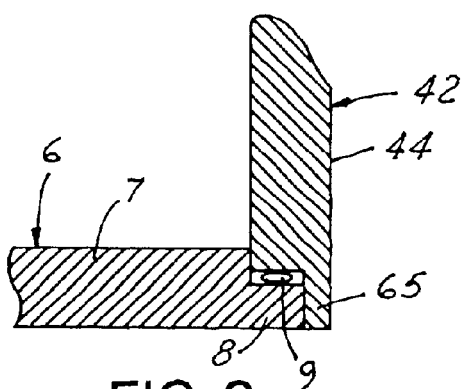
FIG. 8 is a sectional view, taken along section line 8 in FIG. 7, more particularly illustrating a typical flanged configuration of the bottom edge of the PM aided tool of the present invention, sealably engaging the CVD system.
Figure 9:
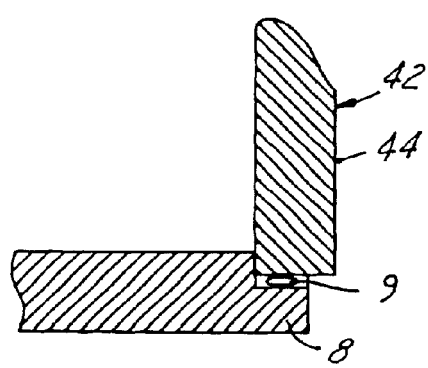
FIG. 9 is a sectional view, illustrating an alternative configuration of the bottom edge of the PM aided tool of the present invention, sealably engaging the CVD system.

Referring next to FIGS. 2–6, 8 and 9 of the drawings, an illustrative embodiment of the preventative maintenance (PM) aided tool of the present invention is generally indicated by reference numeral 40 and is typically capable of use with any type of chemical vapor deposition system sold by Applied Materials, Inc., of Santa Clara, Calif. The PM aided tool 40 includes a tool body 42, typically constructed of clear, translucent acrylic or other lightweight, translucent plastic. It is understood that the tool body 42 may be constructed of any other suitable material. The body 42 includes a generally cylindrical sidewall 44 which has a bottom opening 45 and defines a body interior 43, and an annular wall bevel 46 may angle inwardly from the upper edge of the sidewall 44. An annular bevel flange 47, the purpose of which will be hereinafter described, defines the extending end portion of the wall bevel 46 and is disposed generally perpendicularly with respect to the sidewall 44. A top opening 50 of the body interior 43, closed by a typically rotatable, circular lid panel 51 as hereinafter described, is defined by the bevel flange 47 opposite the bottom opening 45. A leading gap design vacuum line connector 48 extends from the sidewall 44 in fluid communication with the body interior 43, and may be fitted with a suitable quick connect/disconnect coupler (not illustrated) or other coupling mechanism for removable attachment to a vacuum line 67 (FIG. 7). As illustrated in FIGS. 3, 5 and 8, the bottom edge of the sidewall 44 may be characterized by an annular seal flange 65 which defines an annular o-ring notch 63, the purpose of which will be hereinafter described. Alternatively, the bottom edge of the sidewall 44 may be flat, as illustrated in FIG. 9. The diameter of the cylindrical sidewall 44 is sized to close the top opening (not illustrated) on the enclosure assembly 6 of the CVD system 10 upon removal of the lid 18 from the enclosure assembly 6.

As illustrated in FIG. 4, an annular lid panel support flange 52 extends from the wall bevel 46 or alternatively, the sidewall 44, in spaced-apart relationship to the bevel flange 47. The circular lid panel 51 is rotatably mounted between the bevel flange 47 and the lid panel support flange 52 and closes the top opening 50 of the body 42. A gasket, o-ring or other suitable sealing mechanism (not illustrated) may be interposed between the lid panel 51 and the bevel flange 47 or between the lid panel 51 and the lid panel support flange 52 to substantially seal the body interior 43 from the exterior of the PM aided tool 40.

It is understood that the lid panel 51 may be rotatably mounted in the top opening 50 by any mechanism known by those skilled in the art other than by means of the continuous, annular lid panel support flange 52. For example, the lid panel support flange 52 may be replaced by multiple, individual lid panel support tabs (not illustrated) that are spaced around the periphery of the wall bevel 46 or sidewall 44 and engage the bottom surface of the lid panel 51 to hold the lid panel 51 in place in the top opening 50.

As particularly illustrated in FIGS. 2 and 5, a pair of typically semicircular panel openings 53 is provided in the lid panel 51, and each panel opening 53 is selectively opened and closed by a correspondingly-shaped closing panel 55. While the panel openings 53 and closing panels 55 are herein shown and described as having a generally semicircular shape, it is understood that the panel openings 53 and closing panels 55 may have any suitable alternative shape. Accordingly, the straight edge of each typically semicircular closing panel 55 is hingedly attached to the lid panel 51 by means of a pair of panel hinges 57. A panel knob 59 may be provided on the upper surface of each closing panel 55 for selectively opening and closing the corresponding panel opening 53. As illustrated in FIG. 6, the curved edge of each closing panel 55 may be fitted with a closing panel seal flange 56 which mates with a companion lid panel seal flange 54 that is shaped in the lid panel 51 along the curved edge of the panel opening 53. An o-ring, gasket or other suitable sealing mechanism 61 may be provided on the lid panel seal flange 54, the closing panel seal flange 56 or both of these elements to provide a gas-tight seal between the lid panel 51 and the closing panel 55 when the closing panel 55 is in the closed position of FIG. 6. It is understood that the pair of closing panels 55 may be replaced by a single, large closing panel 55 of any desired size and shape for selectively closing a single, correspondingly sized and shaped panel opening 53 in the lid panel 51.

Referring next to FIGS. 7–9 of the drawings, in typical application of the PM aided tool 40 of the present invention, the lid 18 and showerhead 30 components of the CVD system 10 are initially removed from the top 7 of the enclosure assembly 6 using methods which are well-known in the art. Upon such removal of the lid 18 and showerhead 30, the lid o-ring 9 on the top seal flange 8 of the top 7 is exposed. The sidewall 44 of the PM aided tool 40 is next lowered into the lid opening (not illustrated), and the o-ring notch 63 in the bottom edge of the sidewall 44 receives the lid o-ring 9 and top seal flange 8 of the top 7, as illustrated in FIG. 8. Alternatively, in the embodiment of the PM aided tool 40 in which the bottom edge of the sidewall 44 has a flat configuration, the flat bottom edge of the sidewall 44 engages the lid o-ring 9, as illustrated in FIG. 9. In each case, the sidewall 44 forms a gas-tight seal against the top 7 of the enclosure assembly 6, at the lid o-ring 9, and the body interior 43 of the tool body 42 is disposed in fluid communication with the chamber 15. A vacuum line 67 in the clean room environment of the CVD system 10 is removably connected to the vacuum line connector 48.

After the PM aided tool 40 is mounted on the CVD system 10 in the manner heretofore described, the vacuum pump (not illustrated) connected to the vacuum line 67 is energized to induce vacuum pressure in the chamber 15. This action causes suction-induced closing of the closing panels 55 on the PM aided tool 40, against the gasket or o-ring 61 in the manner illustrated with respect to FIG. 6, to initially seal the body interior 43 from the ambient environment of the CVD system 10. Next, one of the closing panels 55 is opened to provide access to the chamber 15 for cleaning purposes. Accordingly, as illustrated in FIG. 7, a chemical dispensing tube 69 or other cleaning instrument can be inserted in the open panel opening 53 to facilitate dispensing water and cleansing chemicals 73 into the chamber 15. Due to the vacuum pressure induced the body interior 43 and chamber 15 through the vacuum line 67, residual process gases and other potentially toxic, flammable, and/or corrosive gases 71 generated in the chamber 15 during the cleansing process are drawn from the chamber 15 and body interior 43 and to a suitable disposal container or system (not shown) through the vacuum line connector 48 and vacuum line 67, respectively. It will be appreciated by those skilled in the art that the gases 71 are incapable of flowing from the chamber 15 and body interior 43 through the open panel opening or openings 53 since the air or gas pressure in the chamber 15 and body interior 43 is negative with respect to the ambient air pressure around the CVD system 10. By rotating the lid panel 51 in the manner indicated by the curved arrow in FIG. 2, the panel openings 53 may be positioned at the desired locations around the top of the tool body 42 for multi-positioning capability of the chemical dispensing tube 69 or other cleaning implement and thus, optimum cleaning of the chamber 15. Furthermore, it will be appreciated by those skilled in the art that the typically translucent appearance of the PM aided tool 40 enables cleaning personnel to locate the chemical dispensing tube 40 or other cleaning implement precisely where needed in the chamber interior 15 for optimum cleaning thereof.

After the PM maintenance operation is completed, the vacuum pressure in the chamber 15 is dispelled by turning off the vacuum pump (not illustrated) attached to the vacuum line 67, the tool body 42 is removed from the enclosure assembly 6 and the showerhead 30 and lid 18 are replaced on the enclosure assembly 6 in conventional fashion to resume normal operation thereof.

While the preferred embodiments of the invention have been described above, it will be recognized and understood that various modifications can be made in the invention and the appended claims are intended to cover all such modifications which may fall within the spirit and scope of the invention.

Having described my invention with the particularity set forth above, I claim:

1. A preventative maintenance aided tool for connection to a vacuum line and preventing escape of gases from a chamber, said tool comprising:
   a tool body for engaging the chamber, said tool body comprising a body interior and a bottom opening;
   at least one panel opening provided in said tool body;
   at least one closing panel for removably sealing said at least one panel opening, respectively; and
   a vacuum line connector carried by said tool body for connection to the vacuum line.

2. The tool of claim 1 wherein said at least one panel opening comprises a pair of panel openings and said at least one closing panel comprises a pair of closing panels.

3. The tool of claim 1 wherein said tool body comprises a sidewall and a lid panel rotatably carried by said sidewall opposite said bottom opening, and wherein said at least one panel opening is provided in said lid panel.

4. The tool of claim 3 wherein said at least one panel opening comprises a pair of panel openings and said at least one closing panel comprises a pair of closing panels.

5. The tool of claim 1 wherein said at least one closing panel is hingedly carried by said tool body.

6. The tool of claim 5 wherein said at least one panel opening comprises a pair of panel openings and said at least one closing panel comprises a pair of closing panels.

7. The tool of claim 5 wherein said tool body comprises a sidewall and a lid panel rotatably carried by said sidewall opposite said bottom opening, and wherein said at least one panel opening is provided in said lid panel and said at least one closing panel is hingedly attached to said lid panel.

8. The tool of claim 7 wherein said at least one panel opening comprises a pair of panel openings and said at least one closing panel comprises a pair of closing panels.

9. The tool of claim 3 further comprising a seal flange provided in said sidewall.

10. The tool of claim 9 wherein said at least one panel opening comprises a pair of panel openings and said at least one closing panel comprises a pair of closing panels.

11. The tool of claim 9 wherein said at least one closing panel is hingedly carried by said tool body.

12. The tool of claim 11 wherein said tool body comprises a sidewall and a lid panel rotatably carried by said sidewall opposite said bottom opening, and wherein said at least one panel opening is provided in said lid panel and said at least one closing panel is hingedly attached to said lid panel.

13. A preventative maintenance aided tool for connection to a vacuum line and preventing escape of gases from a chamber, said tool comprising:
   a tool body for engaging the chamber, said tool body comprising a substantially cylindrical sidewall defining a body interior and a bottom opening;
   a lid panel carried by said sidewall opposite said bottom opening;
   at least one generally semicircular panel opening provided in said lid panel;
   at least one generally semicircular closing panel for removably sealing said at least one panel opening, respectively; and
   a vacuum line connector carried by said tool body for connection to the vacuum line.

14. The tool of claim 13 wherein said at least one closing panel is hingedly carried by said lid panel.

15. The tool of claim 13 further comprising a seal flange provided in said sidewall.

16. The tool of claim 15 wherein said at least one closing panel is hingedly carried by said lid panel.

* * * * *